United States Patent
Kadota et al.

[11] Patent Number: 6,163,099
[45] Date of Patent: Dec. 19, 2000

[54] SURFACE ACOUSTIC WAVE DEVICE HAVING A LANGASITE SINGLE CRYSTAL SUBSTRATE

[75] Inventors: Michio Kadota, Kyoto; Makoto Kumatoriya, Omihachiman, both of Japan

[73] Assignee: Murata Manufacturing Co., Ltd., Kyoto, Japan

[21] Appl. No.: 09/130,926

[22] Filed: Aug. 6, 1998

[30] Foreign Application Priority Data

Aug. 27, 1997 [JP] Japan ................................ 9-231204
Jan. 23, 1998 [JP] Japan ................................ 10-011498

[51] Int. Cl.⁷ ........................................ H03H 9/15
[52] U.S. Cl. ........................................... 310/313 A
[58] Field of Search ........................ 310/313 A, 313 R

[56] References Cited

U.S. PATENT DOCUMENTS

| | | | |
|---|---|---|---|
| 4,567,393 | 1/1986 | Asai et al. | 310/313 A |
| 5,432,392 | 7/1995 | Kadota et al. | 310/313 A |
| 5,446,330 | 8/1995 | Eda et al. | 310/313 R |
| 5,917,265 | 6/1999 | Naumenko et al. | 310/313 A |
| 6,005,325 | 12/1999 | Inoue et al. | 310/313 A |

FOREIGN PATENT DOCUMENTS

| | | | |
|---|---|---|---|
| 0 866 551 | 9/1998 | European Pat. Off. | 310/313 A |
| 0 866 551 A2 | 9/1998 | European Pat. Off. | H03H 9/02 |
| 0 869 609 | 10/1998 | European Pat. Off. | H03H 9/145 |
| 0 869 609 A1 | 10/1998 | European Pat. Off. | H03H 9/145 |
| 44 00 980 | 7/1994 | Germany | H03H 9/25 |
| 08204499 | 8/1996 | Japan | H03H 9/25 |
| 11-27089 | 1/1999 | Japan | 310/313 A |
| WO 97/25776 | 7/1997 | WIPO | 310/313 A |
| WO 97/49182 | 12/1997 | WIPO | 310/313 A |

*Primary Examiner*—Thomas M. Dougherty
*Attorney, Agent, or Firm*—Keating & Bennett, LLP

[57] ABSTRACT

A surface acoustic wave device includes a piezoelectric substrate made of a Langasite single crystal and at least one interdigital transducer including a pair of comb-shaped electrodes which are interdigitated with each other and are in contact with the piezoelectric substrate. The piezoelectric substrate has a Euler angle of approximately (0°, 130° to 170°, 23° to 30°), whereby the surface acoustic wave device has an excellent TCD and also has a large $K^2$ value.

2 Claims, 2 Drawing Sheets

SURFACE ACOUSTIC WAVE DEVICE HAVING A LANGASITE SINGLE CRYSTAL SUBSTRATE

BACKGROUND OF THE INVENTION

1. Field of the Invention

The present invention relates to a surface acoustic wave device and more particularly, to a surface acoustic wave device having an excellent temperature characteristic and a large electromechanical coupling coefficient.

2. Description of the Related Art

Surface acoustic wave devices have been widely used for passband filters in mobile communication equipment. One of the surface acoustic wave devices known in the art is a surface acoustic wave resonator or a resonator filter having a structure in which an interdigital transducer (referred to as an IDT hereinafter) comprising comb-shaped electrodes and reflectors is provided on a piezoelectric substrate. Piezoelectric single crystals such as lithium niobate, lithium tantalate, quartz and PZT-based piezoelectric ceramics are used for the materials of the piezoelectric substrate of a surface acoustic wave resonator or a resonator filter.

In order to obtain good characteristics in the surface acoustic wave device, materials having good temperature characteristics of group delay time (referred to TCD hereinafter), or materials having small characteristic variations due to temperature changes, are thought to be necessary. Lithium niobate described above has a poor TCD while a TCD of lithium tantalate was not so good compared to that of Lithium niobate. Since quartz is well known to have a good TCD, a variety of the surface acoustic wave devices have used quartz to form a substrate of the surface acoustic wave device.

Although the quartz substrate has a good TCD, its electromechanical coupling coefficient (abbreviated as $K^2$ hereinafter) is relatively small when, for example, a Rayleigh wave is excited in a surface acoustic wave device in which an IDT was disposed on the quartz substrate.

Accordingly, there are various problems associated with a low $K^2$ of a quartz substrate. Specifically, when a surface acoustic wave resonator or a surface acoustic wave resonator filter are constructed by disposing an IDT and reflectors on the quartz substrate, a lot of electrode fingers for forming the reflectors are required as compared with the case when the substrate is constructed of materials other than quartz, thereby causing the surface acoustic wave resonator or a surface acoustic wave resonator filter to be significantly larger in size. In addition, the operation band of the surface acoustic wave resonator is narrowed and it is difficult to obtain a wide band characteristic. It is also a problem that the excitation efficiency of the surface acoustic wave is low, which results in a large insertion loss because the excitation resistance of the surface acoustic wave resonance element becomes large when the excitation efficiency for the surface acoustic wave is low.

Moreover, when a transversal type filter is constructed by providing two or more IDTs on the quartz substrate, the insertion loss of the surface acoustic wave filter and surface acoustic wave resonator filter becomes larger than the case when the substrate is constructed of other materials. The low level of $K^2$ of the quartz substrate also results in a narrow passband of the surface acoustic wave filter as compared with the case when the substrate is constructed of other materials.

A leaky surface acoustic wave device comprising a quartz substrate also suffers from the aforementioned problems.

SUMMARY OF THE INVENTION

To overcome the problems described above, the preferred embodiments of the present invention provide a surface acoustic wave device having an excellent TCD and a large value of $K^2$. The preferred embodiments of the present invention also provide a surface acoustic wave device including a piezoelectric substrate made of a Langasite single crystal and at least one interdigital transducer including a pair of comb-shaped electrodes which are interdigitated with each other and are in contact with the piezoelectric substrate. The piezoelectric substrate preferably has a Euler angle of approximately (0°, 130° to 170°, 23° to 30°).

The surface acoustic wave device may further comprise a piezoelectric thin film disposed on the piezoelectric substrate so as to cover the at least one interdigital transducer.

The Euler angle of the piezoelectric substrate is preferably approximately (0°, 140° to 162°, 23° to 27°), and more preferably approximately (0°, 148° to 159°, 23.60° to 26°) so that a larger $K^2$ and an excellent TCD can be achieved. In another preferred embodiment, the Euler angle is approximately (0°, 148°, 23.8°).

When the Euler angle is approximately (0°, 151° to 154°, 24° to 25°), a surface acoustic wave device having a superior TCD along with a power flow angle of zero can be obtained.

When the surface acoustic wave device utilizes a leakage surface acoustic wave, the Euler angle is preferably approximately (0°, 30°, 80°).

According to preferred embodiments of the present invention, the surface acoustic wave device has a greatly improved TCD as compared with a device using lithium niobate and lithium tantalate and a greatly increased $K^2$ value compared with the device using quartz, because a Langasite single crystal having a Euler angle of approximately (0°, 130° to 170°, 23° to 30°) is used for the piezoelectric element. A larger $K^2$ value as compared with that of the device using quartz allows the excitation efficiency of the surface acoustic wave and reflection efficiency of the reflector to be improved when a surface acoustic wave resonance element is constructed, consequently making it possible to reduce the resonance resistance of the surface acoustic wave resonance element.

Further, the passband of the filter is significantly widened when the surface acoustic wave resonance type filter and transversal type surface acoustic wave filter are constructed because of the improved insertion loss.

For the purpose of illustrating the invention, there is shown in the drawings several forms and embodiments which are presently preferred, it being understood, however, that the present invention is not limited to the precise arrangements and instrumentalities shown.

DETAILED DESCRIPTION OF PREFERRED EMBODIMENTS

Hereinafter, the preferred embodiments of the present invention are explained in detail with reference to the drawings.

Figure 1:
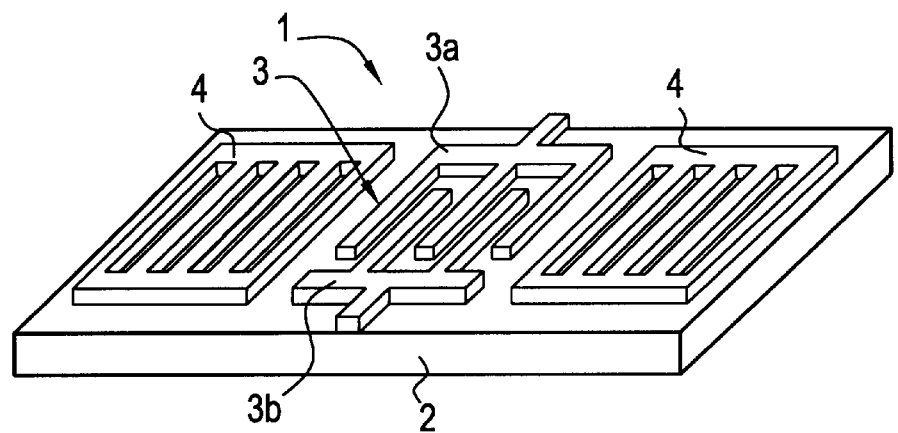
FIG. 1 is a perspective view of a surface acoustic wave resonator according to a first preferred embodiment of the present invention.

FIG. 1 is a perspective view of the surface acoustic wave resonator according to a first preferred embodiment of the present invention.

As shown in FIG. 1, the surface acoustic wave resonator 1 is constructed by disposing an interdigital transducer 3 and two reflectors 4 on the piezoelectric substrate 2 made of a Langasite ($La_3Ga_5SiO_{14}$) single crystal.

The interdigital transducer 3 preferably includes an electrode material such as Al and Au and comprises a pair of comb-shaped electrodes 3a and 3b each having a plurality of finger electrodes. The pair of comb-shaped electrodes 3a and 3b are disposed such that the electrode fingers thereof are interdigitated with each other.

The reflectors 4 are formed of either the same electrode material as the interdigital transducer 3 or a different electrode material. Each of the reflectors 4 comprises a plurality of electrode fingers arranged to form a lattice structure. The reflectors 4 are disposed at both sides on the piezoelectric substrate so that the interdigital transducer 3 is interposed therebetween.

Figure 2:
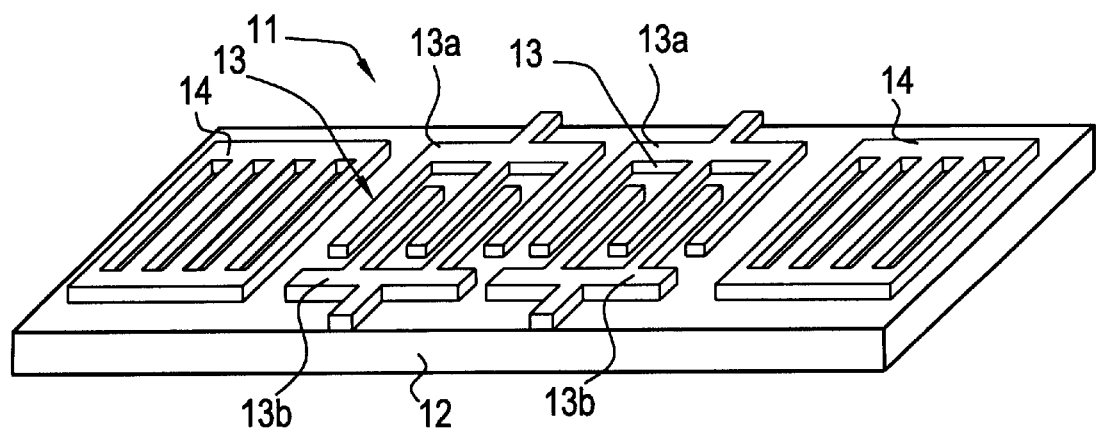
FIG. 2 is a perspective view of a vertically coupled surface acoustic wave resonator filter according to a second preferred embodiment of the present invention.

Next, the second preferred embodiment of the present invention will be described. FIG. 2 is a perspective view of vertically coupled surface acoustic wave resonator filter according to a second preferred embodiment of the present invention.

As shown in FIG. 2, the vertically coupled surface acoustic wave resonator filter 11 is constructed by disposing two interdigital transducers 13 and two reflectors 14 on the piezoelectric substrate 12 made of a material of Langasite ($La_3Ga_5SiO_{14}$) single crystal.

Each of the interdigital transducers 13 is preferably formed of an electrode material such as Al and Au and comprises a pair of comb-shaped electrodes 13a and 13b each having a plurality of electrode fingers. The pair of comb-shaped electrodes 13a and 13b are disposed such that the electrode fingers thereof are interdigitated with each other. The two interdigital transducers 13 are aligned in a surface acoustic wave propagation direction by being spaced by a given distance.

Each of the reflectors 14 is formed of either the same material as the electrode material of the interdigital transducer 13 or a different electrode material and comprises a plurality of electrode fingers which are formed into a lattice structure. The pair of reflectors 14 are disposed at both sides on the piezoelectric substrate so that the two interdigital transducers 13 are interposed therebetween.

Figure 3:
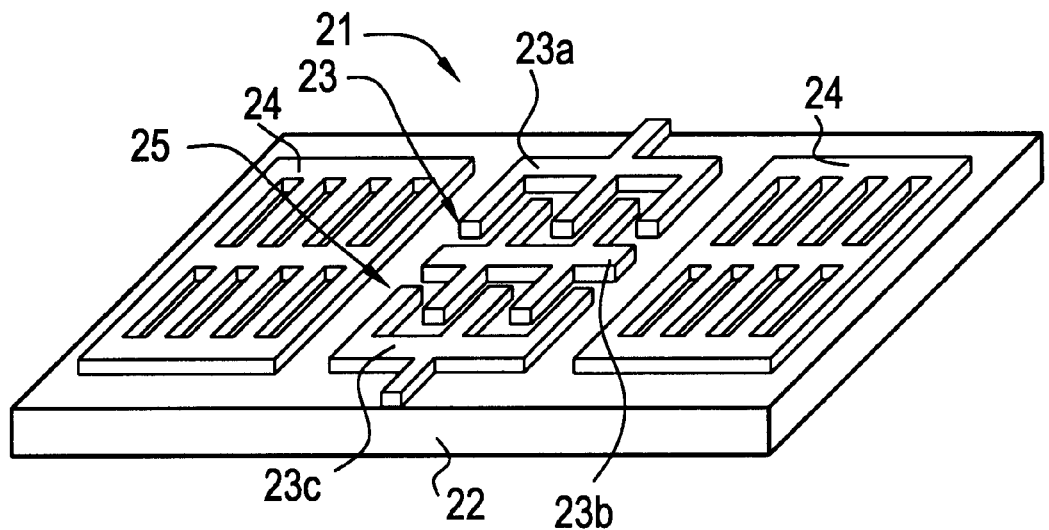
FIG. 3 is a perspective view of a transversally coupled surface acoustic wave resonator filter according to a third preferred embodiment of the present invention.

The third preferred embodiment of the present invention will be described. FIG. 3 is a perspective view of a transversally coupled surface acoustic wave resonator filter according to a third preferred embodiment.

As shown in FIG. 3, the transversally coupled surface acoustic wave resonator filter 21 is constructed by disposing interdigital transducers 23 and 25 and two reflectors 24 on the piezoelectric substrate 22 made of a material of Langasite ($La_3Ga_5SiO_{14}$) single crystal.

The interdigital transducers 23 and 25 are formed of an electrode material such as Al and Au and comprise comb-shaped electrodes 23a, 23b and 23c each having a plurality of electrode fingers. The electrode fingers of each of the comb-shaped electrodes 23a and 23c extend toward a surface acoustic wave propagation direction, while the electrode fingers of the comb-shaped electrode 23b extend towards opposite directions. As a result, the interdigital transducer 23 including the comb-shaped electrode 23a and a portion of the comb-shaped electrode 23b and the interdigital transducer 25 including the comb-shaped electrode 23c and a portion of the comb-shaped electrode 23b are aligned in a direction that is substantially perpendicular to the surface acoustic wave propagation direction.

Each of the reflectors 24 is preferably formed of either the same electrode material as the interdigital transducer 23 or a different electrode material and comprises a plurality of electrode fingers to form two lattice shape reflectors. The two reflectors 24 are disposed at both sides of the piezoelectric substrate 22 so that the interdigital transducers 23 and 25 are interposed therebetween.

The characteristics of the material to be used for the substrate of the surface acoustic wave device as described above with respect to the cut-angle and propagation direction of the surface acoustic wave (Rayleigh wave) are shown in Table 1. The symbol * in front of the sample numbers in Table 1 denotes an example which is not within of the scope of the present invention.

TABLE 1

| Sample No. | Material | Cut angle | Euler angle ($\Phi$, $\theta$, $\phi$) | Accustic velocity (m/s) | $K^2$ (%) | TCD (ppm/° C.) | Power flow angle |
|---|---|---|---|---|---|---|---|
| *1 | Quartz | ST | (0, 132.75, 0) | 3158 | 0.14 | 0 | 0° |
| *2 | $LiNbO_3$ | Y-Z | (0, 90, 90) | 3488 | 4.9 | 84 | 0° |
| *3 | $LiNbO_3$ | 128° Y-X | (0, 38, 0) | 3992 | 5.5 | 74 | 0° |
| *4 | $LiTaO_3$ | Y-Z | (0, 90, 90) | 3230 | 0.72 | 35 | 0° |
| *5 | $LiTaO_3$ | X-112° Y | (90, 90, 112) | 3288 | 0.64 | 18 | 0° |
| *6 | $La_3Ga_5SiO_{14}$ | 120° Y-30 X | (0, 30, 30) | 2468 | 0.307 | −26.7 | 0° |
| *7 | $La_3Ga_5SiO_{14}$ | Y | (0, 90, 0) | 2337 | 0.342 | −56.2 | 0° |
| *8 | $La_3Ga_5SiO_{14}$ | 40° Y-20° X | (0, 130, 20) | 2659 | 0.308 | −26.3 | 12° |
| 9 | $La_3Ga_5SiO_{14}$ | 40° Y-23° X | (0, 130, 23) | 2676 | 0.336 | −12.5 | 1° |
| 10 | $La_3Ga_5SiO_{14}$ | 40° Y-30° X | (0, 130, 30) | 2717 | 0.213 | −10.9 | 0° |
| *11 | $La_3Ga_5SiO_{14}$ | 40° Y-40° X | (0, 130, 40) | 2736 | 0.138 | −11 | 0° |
| 12 | $La_3Ga_5SiO_{14}$ | 60° Y-30° X | (0, 150, 30) | 2734 | 0.344 | −1.6 | 0° |
| 13 | $La_3Ga_5SiO_{14}$ | 80° Y-30° X | (0, 170, 30) | 2680 | 0.306 | −11 | −9° |

Although TCD is slightly decreased when the Langasite ($La_3Ga_5SiO_{14}$) single crystal is used than when quartz is used, $K^2$ value is greatly increased. However, this does not result in an appreciable characteristic change in the application field of communication instruments provided that the absolute value of TCD is around 10 ppm/° C.

As is understood from Table 1, a surface acoustic wave device having an improved TCD and having a larger $K^2$ value as compared with the surface acoustic wave device using quartz can be obtained since the absolute value of TCD is 10 ppm/° C. or less and $K^2$ value is 0.2% or more in the range of the Euler angle of about (0°, 130° to 170°, 23° to 30°), or in the range of the samples No. 9, 10, 12 and 13.

Accordingly, when the Langasite ($La_3Ga_5SiO_{14}$) single crystal is used for the piezoelectric substrates 2, 12 and 22 of the surface acoustic wave resonator shown in FIG. 1 and the surface acoustic wave resonator filter shown in FIG. 2 and FIG. 3, a surface acoustic wave device having a wider band and smaller insertion loss as compared with the surface acoustic wave device using quartz can be obtained. It is also possible in the surface acoustic wave resonance element type filter to reduce the number of electrode fingers of the reflector due to an improved reflection efficiency of the reflector, thus enabling the surface acoustic wave filter to be made much more compact. Moreover, since the absolute value of TCD is about 11 ppm/° C. or less, the device is not affected by large temperature variations in a surrounding environment.

It is also understood from Table 1 that the acoustic velocity is smaller in the Langasite ($La_3Ga_5SiO_{14}$) single crystal than in quartz, lithium niobate or lithium tantalate materials. This means that, the smaller the acoustic velocity in the piezoelectric substrate is, the space between the electrode fingers of the comb-shaped electrode and the reflector may be smaller as compared at the same frequency.

Accordingly, because the acoustic velocity becomes smaller in the Langasite ($La_3Ga_5SiO_{14}$) single crystal than in quartz, lithium niobate and lithium tantalate, the device can be made more compact than the device using quartz, lithium niobate and lithium tantalate.

More detailed characteristics with respect to the cut angle of the Langasite single crystal and the transmission direction of the surface acoustic wave (Rayleigh wave) are shown in Table 2.

TABLE 2

| Sample No. | Material | Cut angle | Euler angle ($\Phi$, $\theta$, $\phi$) | Accustic velocity (m/s) | $K^2$ (%) | TCD (ppm/° C.) | Power flow angle |
|---|---|---|---|---|---|---|---|
| 14 | $La_3Ga_5SiO_{14}$ | 50° Y-23° X | (0, 140, 23) | 2744 | 0.42 | −6.5 | 5.8° |
| 15 | $La_3Ga_5SiO_{14}$ | 50° Y-24° X | (0, 140, 24) | 2747 | 0.40 | −6.0 | 1.3° |
| 16 | $La_3Ga_5SiO_{14}$ | 50° Y-27° X | (0, 140, 27) | 2746 | 0.34 | −3.4 | 2.5° |
| 17 | $La_3Ga_5SiO_{14}$ | 51° Y-25° X | (0, 141, 25) | 2751 | 0.38 | −3.4 | 0° |
| 18 | $La_3Ga_5SiO_{14}$ | 52° Y-24.6° X | (90, 142, 24.6) | 2754 | 0.41 | −4.3 | 0° |
| 19 | $La_3Ga_5SiO_{14}$ | 53° Y-24.2° X | (0, 143, 24.2) | 2756 | 0.44 | −5.0 | 0° |
| 20 | $La_3Ga_5SiO_{14}$ | 54° Y-24.1° X | (0, 144, 24.1) | 2759 | 0.46 | −3.3 | 0° |
| 21 | $La_3Ga_5SiO_{14}$ | 55° Y-24° X | (0, 145, 24) | 2761 | 0.46 | −3.3 | 0° |
| 22 | $La_3Ga_5SiO_{14}$ | 56° Y-24° X | (0, 146, 24) | 2763 | 0.44 | −3.3 | 0° |
| 23 | $La_3Ga_5SiO_{14}$ | 57° Y-23.8° X | (0, 147, 23.8) | 2764 | 0.49 | −2.1 | 0° |
| 24 | $La_3Ga_5SiO_{14}$ | 57° Y-24° X | (0, 147, 24) | 2764 | 0.42 | −3.3 | 0° |
| 25 | $La_3Ga_5SiO_{14}$ | 58° Y-23.4° X | (0, 148, 23.4) | 2765 | 0.51 | −2.4 | 1.42° |
| 26 | $La_3Ga_5SiO_{14}$ | 58° Y-23.5° X | (0, 148, 23.5) | 2765 | 0.51 | −2.4 | 1.07° |
| 27 | $La_3Ga_5SiO_{14}$ | 58° Y-23.6° X | (0, 148, 23.6) | 2765 | 0.51 | −2.0 | 0.59° |
| 28 | $La_3Ga_5SiO_{14}$ | 58° Y-23.7° X | (0, 148, 23.7) | 276S | 0.50 | −1.8 | 0.12° |
| 29 | $La_3Ga_5SiO_{14}$ | 58° Y-23.8° X | (0, 148, 23.8) | 2765 | 0.67 | −1.7 | 0° |
| 30 | $La_3Ga_5SiO_{14}$ | 58° Y-24° X | (0, 148, 24) | 2765 | 0.50 | −1.5 | 0° |
| 31 | $La_3Ga_5SiO_{14}$ | 58° Y-23.9° X | (0, 149, 23.9) | 2765 | 0.50 | −1.5 | 0° |
| 32 | $La_3Ga_5SiO_{14}$ | 58° Y-24° X | (0, 149, 24) | 2765 | 0.50 | −1.5 | 0° |
| 33 | $La_3Ga_5SiO_{14}$ | 58° Y-24° X | (0, 150, 24) | 276S | 0.51 | −1.5 | 0° |
| 34 | $La_3Ga_5SiO_{14}$ | 58° Y-23° X | (0, 151, 23) | 2760 | 0.47 | −3.1 | 15.3° |
| 35 | $La_3Ga_5SiO_{14}$ | 58° Y-24° X | (0, 151, 24) | 2764 | 0.51 | −0.9 | 0° |
| 36 | $La_3Ga_5SiO_{14}$ | 58° Y-24.15° X | (0, 151, 24.15) | 2764 | 0.50 | −0.9 | 0° |
| 37 | $La_3Ga_5SiO_{14}$ | 58° Y-24.3° X | (0, 152, 24.3) | 2763 | 0.50 | −0.9 | 0° |
| 38 | $La_3Ga_5SiO_{14}$ | 58° Y-24.5° X | (0, 153, 24.5) | 2761 | 0.50 | −0.9 | 0° |
| 39 | $La_3Ga_5SiO_{14}$ | 58° Y-24.7° X | (0, 154, 24.7) | 2759 | 0.49 | −0.9 | 0° |
| 40 | $La_3Ga_5SiO_{14}$ | 58° Y-25° X | (0, 154, 25) | 2759 | 0.49 | −0.9 | 0° |
| 41 | $La_3Ga_5SiO_{14}$ | 58° Y-26° X | (0, 154, 26) | 2756 | 0.46 | −1.5 | 3.6° |
| 42 | $La_3Ga_5SiO_{14}$ | 58° Y-24.9° X | (0, 155, 24.9) | 2757 | 0.45 | −1.3 | 0° |
| 43 | $La_3Ga_5SiO_{14}$ | 58° Y-25.1° X | (0, 156, 25.1) | 2754 | 0.47 | −1.5 | 0° |
| 44 | $La_3Ga_5SiO_{14}$ | 58° Y-25° X | (0, 157, 25) | 2750 | 0.46 | −1.5 | 0° |
| 45 | $La_3Ga_5SiO_{14}$ | 58° Y-26° X | (0, 158, 26) | 2746 | 0.46 | −1.5 | 0° |
| 46 | $La_3Ga_5SiO_{14}$ | 58° Y-26° X | (0, 159, 26) | 2743 | 0.53 | −1.5 | 0° |
| 47 | $La_3Ga_5SiO_{14}$ | 58° Y-26° X | (0, 160, 26) | 2739 | 0.43 | −3.3 | 0° |
| 48 | $La_3Ga_5SiO_{14}$ | 58° Y-26.5° X | (0, 161, 26.5) | 2734 | 0.42 | −3.3 | 0° |
| 49 | $La_3Ga_5SiO_{14}$ | 58° Y-27° X | (0, 161, 27) | 2733 | 0.43 | −3.5 | 0° |
| 50 | $La_3Ga_5SiO_{14}$ | 58° Y-27° X | (0, 162, 27) | 2729 | 0.42 | −5.1 | 0° |

It is understood from Table 2 that, when the Euler angle in the Langasite ($La_3Ga_5SiO_{14}$) single crystal is within the range of approximately (0°, 140° to 162°, 23° to 27°), or in the range of samples No. 14 to 50, the absolute value of TCD is 6.5 ppm/° C. or less and $K^2$ value is 0.3% or more. Thus, the absolute value of TCD is greatly improved and the $K^2$ value is larger as compared with the other portions shown in Table 1.

It is also understood from Table 2 that, when the Euler angle is within the range of approximately (0°, 148° to 159°, 23.6° to 26°), or in the range of samples No. 27 to 46, the absolute value of TCD is about 2 ppm/° C. or less and $K^2$ value is about 0.46% or more. This reveals that TCD is half or less as much as the other portions and the $K^2$ value is larger as compared with the other portions shown in Table 2.

Moreover, when the Euler angle is within the range of approximately (0°, 151° to 154°, 24° to 25°), or in the range of samples No. 35 to 40, the absolute value of TCD is about 0.9 ppm/° C. or less and $K^2$ value is about 0.49% or more. This means that a temperature characteristic close to that of quartz is obtainable and shows little characteristic changes due to temperature variations when the Euler angles are adjusted in the range of approximately (0°, 151° to 154°, 24° to 25°).

There is another advantage that the power flow angle is 0° in addition to the fact that TCD is excellent and $K^2$ value is large in the range of the Euler angle of approximately (0°, 151° to 154°, 24° to 25°). The power flow angle is an indication of the directional deviation of the surface acoustic wave propagation direction. When this angle is not 0°, the interdigital transducer is required to be formed at the position corresponding to this deviation. However, this requirement can be ignored in the Euler angle range of approximately (0°, 151° to 154°, 24° to 25°) since the power flow angle is 0°. Accordingly, all the three factors of TCD, $K^2$ and 0° of the power flow angle are satisfied in the Euler angle range of approximately (0°, 151° to 154°, 24° to 25°).

As shown in Table 2, the maximum $K^2$ value of about 0.67% is attained especially when the Euler angles is approximately (0°, 149°, 23.8°), or in the sample No. 29, to thereby provide a surface acoustic wave device having a significantly wider band as compared with the other portions.

Although the surface acoustic wave device explained hereinabove utilizes a Rayleigh wave, the surface acoustic wave device of preferred embodiments of the present invention may be adapted to use a leaky surface acoustic wave. The characteristics depending on the cut angle of the material to be used for the substrate of the surface acoustic wave device in FIG. 1 and on the propagation direction of the leaky surface acoustic wave are shown below. The symbol * included in front of the sample numbers in Table 3 indicates an example that is not within the scope of the present invention.

Figure 4:
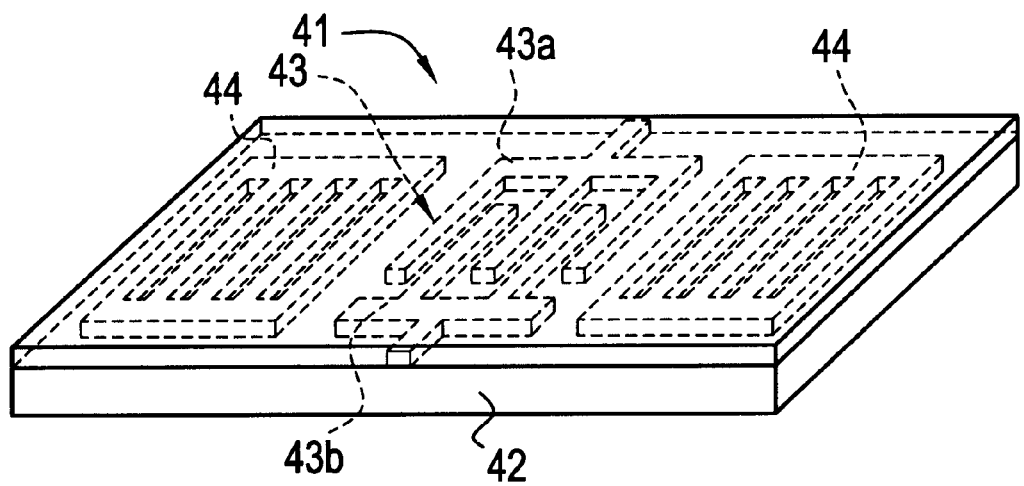
FIG. 4 is a perspective view of a surface acoustic wave resonator according to a fourth preferred embodiment of the present invention.

As shown in FIG. 4, the surface acoustic wave resonator 41 is constructed by disposing the interdigital transducer 43 as well as the piezoelectric thin film 44 on the piezoelectric substrate 42 made of the Langasite ($La_3Ga_5SiO_{14}$) single crystal.

The interdigital transducer 43 comprises a pair of comb-shaped electrodes 43a and 43b disposed on the piezoelectric substrate 42 as explained hereinabove.

The piezoelectric thin film 44 is composed of, for example, a material such as ZnO. The piezoelectric thin film 44 functions to bring the absolute value of TCD near zero by offsetting TCD of the piezoelectric substrate 42 and piezoelectric thin film 44 with each other in a manner such that a material having a positive TCD is selected when TCD of the piezoelectric substrate 42 is negative and a material having a negative TCD is selected when TCD of the piezoelectric substrate 42 is positive.

The $K^2$ value can be made significantly larger in the fourth preferred embodiment as compared with the first preferred embodiment since the piezoelectric thin film 44 is disposed on both of the piezoelectric substrate 42 and interdigital transducer 43.

While the fourth preferred embodiment was described referring to the surface acoustic wave resonator, the preferred embodiments are not limited thereto but are applicable to a vertically coupled surface acoustic wave resonator filter or to a transversally coupled surface acoustic wave resonator filter.

Although the first to fourth preferred embodiments were described referring to the surface acoustic wave resonator, the vertically coupled surface acoustic wave resonator filter and the transversally coupled surface acoustic wave resonator filter, the preferred embodiments are not limited thereto but may be applicable to surface acoustic wave devices such as, for example, a transversal surface acoustic wave filter having a plurality of interdigital transducers or a

TABLE 3

| Sample No. | Material | Cut angle | Euler angle (Φ, θ, φ) | Accustic velocity (m/s) | $K^2$ (%) | TCD (ppm/° C.) | Power flow angle |
|---|---|---|---|---|---|---|---|
| *51 | Quartz | LST | (0, 15, 0) | 3948 | 0.11 | 0 | 0° |
| *52 | $LiNbO_3$ | 41° Y-Z | (0, 131, 0) | 4792 | 17.2 | 78 | 0° |
| *53 | $LiNbO_3$ | 64° Y-X | (0, 154, 0) | 4742 | 11.3 | 79 | 0° |
| *54 | $LiTaO_3$ | 36° Y-Z | (0, 126, 0) | 4212 | 4.7 | 45 | 0° |
| 55 | $La_3Ga_5SiO_{14}$ | 120° Y-80° X | (0, 30, 80) | 3046 | 0.197 | 5.4 | 10.5° |
| *56 | $La_3Ga_5SiO_{14}$ | 80° Y-40° X | (0, 170, 40) | 3039 | 0.23 | 23.9 | 16.5° |

As shown in Table 3, in the case where the leaky surface acoustic wave is used, when the Euler angle of the Langasite ($La_3Ga_5SiO_{14}$) single crystal is approximately (0°, 30°, 80°), or in the sample No. 55, the absolute value of TCD is 5.4 ppm/° C. and $K^2$ is 0.197%, whereby a surface acoustic wave device having an excellent TCD and larger $K^2$ value as compared with the surface acoustic wave device using quartz is obtained.

The fourth preferred embodiment of the present invention is described below. FIG. 4 is a perspective view of the surface acoustic wave resonator according to the fourth preferred embodiment of the present invention.

ladder filter in which the surface acoustic wave resonators are connected to form a ladder circuit, thereby obtaining the same effect of the present invention.

While the surface acoustic wave device having the reflector was described in the first to fourth preferred embodiments of the present invention, the preferred embodiments are not limited thereto but are applicable to the surface acoustic wave device having no reflectors.

While preferred embodiments of the present invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
   a piezoelectric substrate made of a Langasite single crystal; and
   at least on interdigital transducer including a pair of comb-shaped electrodes arranged to be interdigitated with each other and in contact with the piezoelectric substrate, wherein the piezoelectric substrate has a Euler angle of approximately (0°, 30°, 80°), an absolute value of temperature coefficient of group delay time (TCD) is 10 ppm/° C. or less, and an electromechanical coupling coefficient ($K^2$) is 0.2% or more.

2. A surface acoustic wave device according to claim 6, further comprising a piezoelectric thin film disposed on the piezoelectric substrate so as to cover the interdigital transducer.

* * * * *